United States Patent
Lee et al.

(10) Patent No.: US 11,133,486 B2
(45) Date of Patent: Sep. 28, 2021

(54) ELECTROLUMINESCENT LIGHTING DEVICE

(71) Applicant: LG Display Co., Ltd., Seoul (KR)

(72) Inventors: Jungeun Lee, Paju-si (KR); TaeJoon Song, Paju-si (KR); Kyungha Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 114 days.

(21) Appl. No.: 16/715,590

(22) Filed: Dec. 16, 2019

(65) Prior Publication Data

US 2020/0212345 A1    Jul. 2, 2020

(30) Foreign Application Priority Data

Dec. 28, 2018  (KR) ..................... 10-2018-0172065

(51) Int. Cl.
*H01L 51/52*   (2006.01)
*H01L 51/00*   (2006.01)

(52) U.S. Cl.
CPC ...... *H01L 51/5218* (2013.01); *H01L 51/0048* (2013.01); *H01L 51/5234* (2013.01); *H01L 51/5253* (2013.01); *H01L 51/5271* (2013.01)

(58) Field of Classification Search
CPC ............ H01L 51/5218; H01L 51/5271; H01L 51/5253; H01L 51/5234
See application file for complete search history.

(56) References Cited

U.S. PATENT DOCUMENTS

2019/0207150 A1*  7/2019  Kwon ................. H01L 51/5206

* cited by examiner

*Primary Examiner* — Anthony Ho
(74) *Attorney, Agent, or Firm* — Seed IP Law Group LLP (57) ABSTRACT

The present disclosure relates to an electroluminescent lighting device. The present disclosure provides an electroluminescence light device comprising: a substrate including an emission area and a non-emission area surrounding the emission area; a routing line surrounding the emission area at the non-emission area; an auxiliary line being disposed in the emission area, connecting the routing line and defining a pixel area; a reflective electrode disposed within the pixel area; a high resistance layer covering the routing line, the auxiliary line and the reflective electrode; an emission layer on the high resistance layer over the emission area; and a cathode layer on the emission layer.

18 Claims, 3 Drawing Sheets

ELECTROLUMINESCENT LIGHTING DEVICE

CROSS-REFERENCE TO RELATED APPLICATIONS

This application claims the benefit of the Korean Patent Application No. 10-2018-0172065 filed on Dec. 28, 2018, which is hereby incorporated by reference as if fully set forth herein.

BACKGROUND

Technical Field

The present disclosure relates to an electroluminescent lighting device. Especially, the present disclosure relates to an electroluminescent lighting device having an organic light emitting element and providing the lights to top side of the substrate.

Description of the Related Art

Recently, a series of researches has been actively conducted to use an organic light emitting element as a light source of the lighting device or a display device, based on many advantages and/or merits of an organic light emitting device. For example, a surface light source and/or a point light source applied with the organic light emitting element are applied to the lighting system for the vehicles such as an interior mood lamp, a head lamp, a fog lamp, a retracted lamp, a car light, a number light, a tail lamp, a brake light, a turn signal lamp and so on.

When an organic light emitting element is applied to the lighting device, it is preferred to have a robust structure against the foreign materials such as moisture and oxygen which can penetrate from the outside according to its applied environment. In addition, due to the loss of light amount occurred in the organic light emitting element itself, the luminescent efficiency may be degraded. It is preferable for the lighting device to provide the more light amount with the lower power consumption and to have the excellent efficiency with higher ratio of the emission area to the device area. In order to ensure all conditions, the inventors have decided to develop a new structure totally different from the conventional art.

BRIEF SUMMARY

The purpose of the present disclosure, as for solving the problems described above, is to provide an electroluminescent lighting device providing the lights to the top side of the device substrate. Another purpose of the present disclosure is to provide an electroluminescent lighting device having the maximized ratio of the emission area to the substrate area of the device.

For the purposes above mentioned, the present disclosure provides an electroluminescence light device comprising: a substrate including an emission area and a non-emission area surrounding the emission area; a routing line surrounding the emission area at the non-emission area; an auxiliary line being disposed in the emission area, connecting the routing line and defining a pixel area; a reflective electrode disposed within the pixel area; a high resistance layer covering the routing line, the auxiliary line and the reflective electrode; an emission layer on the high resistance layer over the emission area; and a cathode layer on the emission layer.

In one embodiment, the auxiliary line has a plurality of strip patterns arrayed with a predetermine distance within the emission area; and the pixel area is disposed between each of the strip pattern.

In one embodiment, the auxiliary line has a mesh pattern arrayed with a predetermined distance within the emission area; and the pixel area is disposed in each of the mesh pattern.

In one embodiment, the routing line, the auxiliary line and the reflective electrode include an opaque metal material; and the reflective electrode is separated from the auxiliary line with a predetermine distance.

In one embodiment, an emission element is configured by a sequentially stacking structure of the high resistance layer, the emission layer and the cathode layer within the pixel area.

In one embodiment, the high resistance layer is disposed in a space between the auxiliary line and the reflective electrode.

In one embodiment, the electroluminescent lighting device further comprises: a passivation layer disposed under the high resistance layer and covering the auxiliary layer; and a contact hole penetrating the passivation layer for connecting the auxiliary line and the high resistance layer.

In one embodiment, the passivation layer is disposed in a space between the auxiliary line and the reflective electrode.

In one embodiment, the passivation layer covers the auxiliary line as contacting an upper surface and a sidewall surface of the auxiliary line.

In one embodiment, the high resistance layer is disposed in a space between a sidewall surface of the passivation layer contacting the sidewall of the auxiliary line and the reflective electrode.

In one embodiment, the high resistance layer has a sheet resistance with a range of $10^8 \sim 10^9 \Omega/\square$.

In one embodiment, the high resistance layer includes a conductive body of 1~10% contents, a solvent of 80~90% contents, a binder of 10~20% contents and an additive of 1% contents.

In one embodiment, the conductive body includes PEDOT:PSS (poly(3,4-ethylenedioxythiophene) polyatyrene sulfonate) as a conducting polymer.

In one embodiment, the binder includes any one of TEOS (tetraethly orthosilicate), SSQ, silicon-based polysiloxane and acryl-based polysiloxane.

In one embodiment, the conductive body includes any one of a graphenen or a single-walled CNT (SWCNT) or a multi-walled CNT (MWCNT).

In one embodiment, the conductive body includes any one of a copper nanowire (CuNW), a silver nanowire (AgNW) and a gold nanowire (AuNW).

In one embodiment, the cathode layer includes a transparent conductive layer and a metal layer stacked each other.

In one embodiment, the cathode layer further includes: a first transparent conductive layer under the metal layer; and a second transparent conductive layer on the metal layer.

The electroluminescent lighting device according to the present disclosure is the top emission type lighting device in which the irradiation lights are provided to the top side of the substrate. Therefore, regardless of the lower structure of the lighting device, the ratio of the emission area to the total substrate area may be maximized. In addition, applying the ultra-thin semi-transparent metal layer to the transparent cathode layer, the light transmittance to a specific wavelength can be maximized so that the light efficiency can be enhanced.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Reference will now be made in detail to the exemplary embodiments of the present disclosure, examples of which are illustrated in the accompanying drawings. Wherever possible, the same reference numbers will be used throughout the drawings to refer to the same or like parts. In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows. Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case that "comprise," "have," and "include" described in the present specification are used, another part may also be present unless "only" is used. The terms in a singular form may include plural forms unless noted to the contrary.

In construing an element, the element is construed as including an error range although there is no explicit description.

In describing a positional relationship, for example, when the positional order is described as "on," "above," "below," and "next," the case of no contact therebetween may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

First Embodiment

Figure 1:
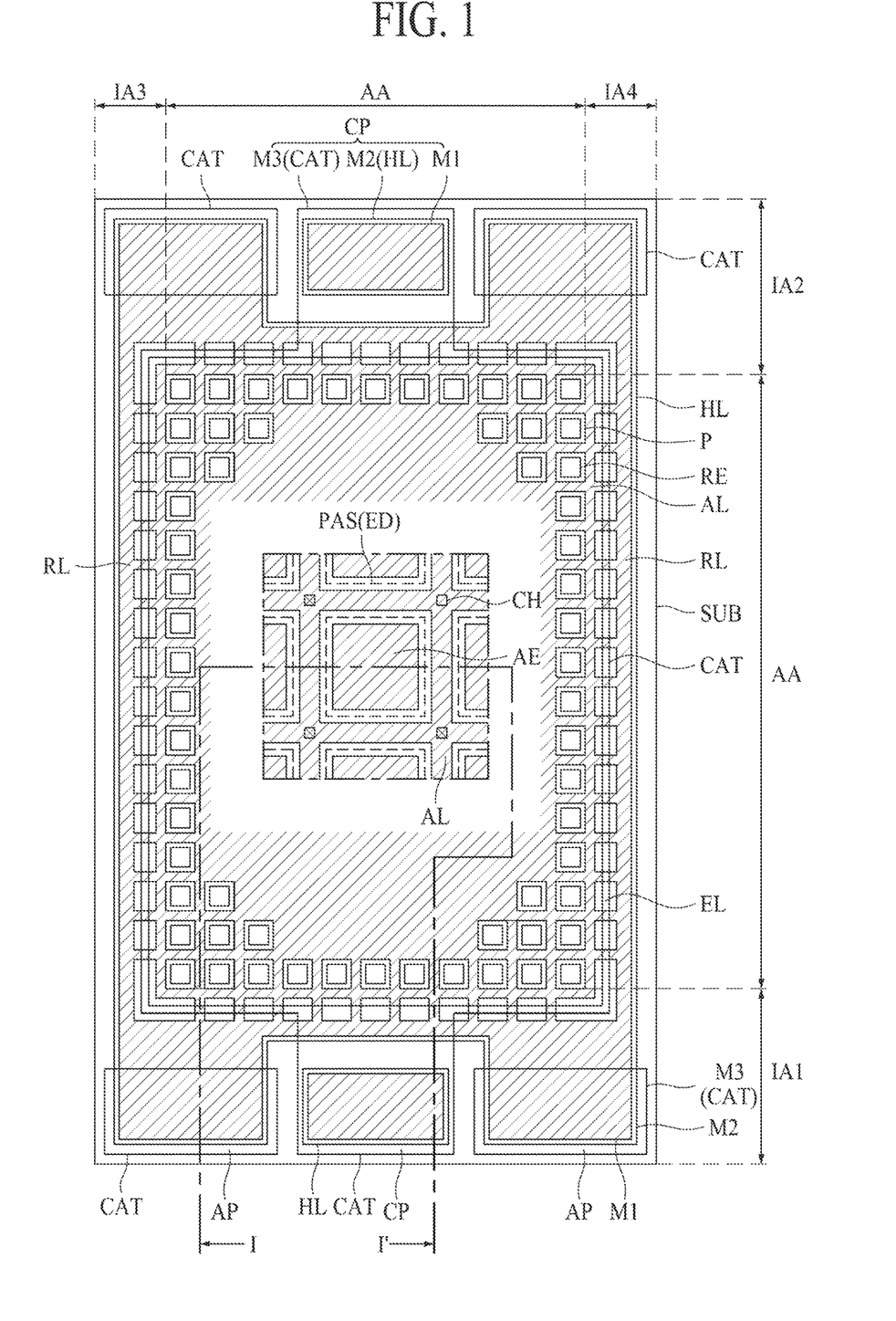
FIG. 1 is a plan view illustrating an electroluminescent lighting device according to the first embodiment of the present disclosure.
Figure 2:
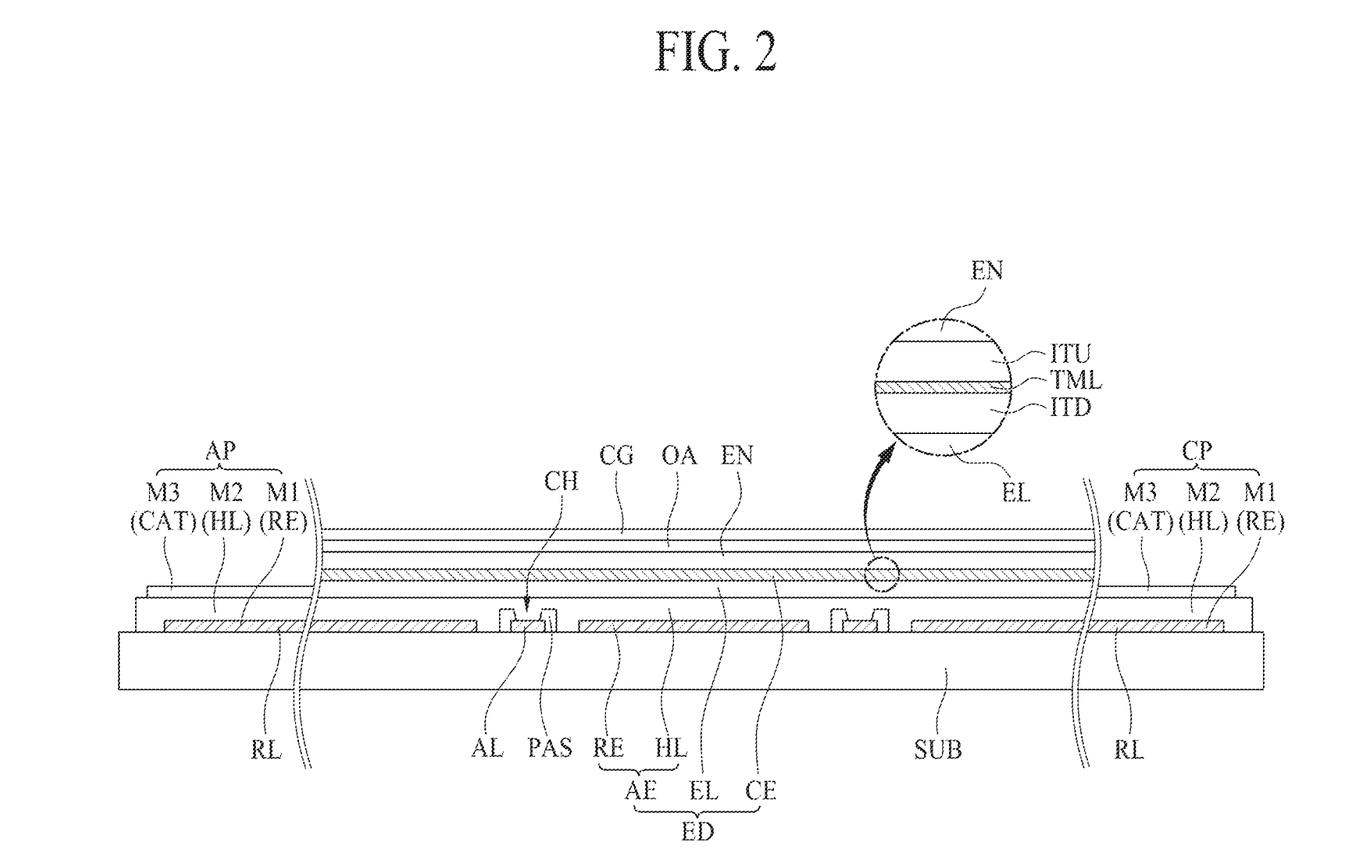
FIG. 2 is a cross-sectional view, taken along the cutting line I-I' in FIG. 1, illustrating a structure of an electroluminescent lighting device according to the first embodiment of the present disclosure.

Hereinafter, referring to FIGS. 1 and 2, an electroluminescent lighting device according to the first embodiment of the present disclosure will be explained. FIG. 1 is a plan view illustrating an electroluminescent lighting device according to the first embodiment of the present disclosure. FIG. 2 is a cross-sectional view, taken along the cutting line I-I' in FIG. 1, illustrating a structure of an electroluminescent lighting device according to the first embodiment of the present disclosure. In this embodiment, the lighting device is an organic luminance lighting device, but it is not limited thereto.

Referring to FIGS. 1 and 2, the electroluminescent lighting device according to the first embodiment of the present disclosure comprises a substrate SUB, a routing line RL, an auxiliary line AL, a reflective electrode RE, a high resistance layer HL, an emission layer EL, a cathode layer CAT, an emission element ED, a first pad AP, a second pad CP, an encapsulation layer EN and a cover glass CG.

The substrate SUB, as a based substrate (or a base layer), includes a plastic material or a glass material. For example, the substrate SUB may include an opaque or a colored polyimide material. The substrate SUB may include a flexible substrate or a rigid substrate. For example, the flexible substrate SUB may be made of glass material may be a thinned glass substrate having a thickness of 100 micrometer or less, or may be etched glass substrate to have a thickness of 100 micrometer or less.

The lighting device may have various shapes and the properties suitable for the functional purposes. Therefore, it is preferable that the substrate SUB has the characteristics suitable for its function and purpose. For example, the substrate SUB may be formed of an opaque material to provide the lights in only one direction of the substrate SUB, or may be formed of a transparent material to provide the lights in both directions of the substrate SUB. In one example, the substrate SUB, in a plan view, may have a rectangular shape, a rounded rectangular shape in which each corner is rounded with a certain radius of curvature, a non-square shape having at least 5 sides, a circular shape or an elliptical shape. As determining the shape and size of the lighting device, the substrate SUB may have various shapes such as an elongated rectangle, a regular rectangle, a rhombus, and a polygon.

The substrate SUB may include an emission area AA and a non-emission area IA. The emission area AA is disposed in the most middle portions of the substrate SUB which can be defined as an area for emitting the lights. In one example, the emission area AA may have, in a plan view, a rectangular shape, a rounded rectangular shape and non-rectangular shape having at least 5 sides. The emission area AA may have the same shape as the substrate SUB, but is not necessarily. The emission area AA may have the different shape from that of the substrate SUB for the manufacturing purposes and/or the functional requirements.

The non-emission area IA is provided in the circumferential area of the substrate SUB to surround the emission area AA, which may be defined as an area in which light is not provided therefrom. In one example, the non-emission area IA may include a first non-emission area IA1 disposed at the first side of the substrate SUB, a second non-emission area IA2 disposed at the second side parallel to the first non-emission area IA1, a third non-emission area IA3 disposed at the third side perpendicular to the first non-emission area IA1, and a fourth non-emission area IA4 disposed at the fourth side parallel to the third non-emission area IA3. In detail, the first non-emission area IA1 may be set on the upper side (or lower side) of the substrate SUB, the second non-emission area IA2 may be set on the lower side (or upper side) of the substrate SUB, the third non-emission area IA3 may be set on the left side (or right side) of the substrate SUB, and the fourth non-emission area IA4 may be set on the right side (or left side) of the substrate SUB. But it is not restricted thereto.

A buffer layer (not shown) may be deposited on the whole surfaces of the substrate SUB. In the case that the glass or metal material is used for the substrate SUB, the buffer layer may be omitted. For the case of a flexible lighting device, it is preferable to deposit the buffer layer, at first on the plastic substrate SUB.

The buffer layer is the element for preventing the foreign materials such as moisture or oxygen from intruding into the emission element ED. For example, the buffer layer may include a plurality of inorganic layers in which different inorganic materials are alternately stacked each other. In one example, the buffer layer may include a multiple layers in which two or more inorganic layers of any one of the silicon oxide (SiOx), the silicon nitride (SiNx) and the silicon oxy-nitride layer (SiON). The buffer layer may have at least two of organic layer and inorganic layer stacked alternately each other.

The routing line RL is arranged at the non-emission area IA on the buffer layer (not shown) or the substrate SUB. For example, the routing line RL may be disposed as a rectangular band shape continuously linked along the path from the first non-emission area IA1, the second non-emission area IA2, the third non-emission area IA3 to the fourth non-emission area IA4 to surround the emission area AA. A first layer M1 of the first pad AP may be further included as being extended from routing line RL to the first non-emission area IA1 and/or the second non-emission area IA2.

In addition, a first layer M1 of the second pad CP further included. It is preferable that the first layer M1 of the second pad CP is disposed at the non-emission area IA. Especially, it is preferable that the first layer M1 of the second pad CP is physically and electrically separated from the first layer M1 of the first pad AP. For example, the first layer M1 of the first pad AP may be separated into two parts in which each of them are disposed at both sides of the first non-emission area IA1, respectively, and the first layer M1 of the second pad CP may be disposed at the middle of the first non-emission area IA1. For another example, the first layer M1 of the first pad AP and the first layer M1 of the second pad CP may be further disposed at the second non-emission area IA2, as being the symmetry structure.

The auxiliary line AL is formed on the substrate SUB or the buffer layer. Especially, the auxiliary line AL may be arranged as being a mesh/grid pattern. As FIG. 1 shows that the auxiliary line AL is patterned as having a plurality of meshes having a predetermined square area, but it is not restricted thereto. By the mesh structure of the auxiliary line AL, the unit pixel area P may be defined as corresponding to the mesh shape. The auxiliary line AL may be uniformly distributed within the emission area AA in order to maintain a uniform electric power voltage.

The reflective electrode RE is disposed within the pixel P area defined by the auxiliary line AL. The reflective electrode RE may have an island shape separated from the auxiliary line AL with a predetermined distance.

It is preferable that the routing line RL, the auxiliary line AL and the reflective electrode RE are made of the same material. For example, depositing an opaque metal material on the substrate SUB or the buffer layer, and patterning it to form the routing line RL, the auxiliary line AL and the reflective electrode RE. The routing line RL, the first layer M1 of the first pad AP and the auxiliary line AL may be linked each other, but the reflective electrode RE may have an island shape to be separated from them. Further, it is preferable that the first layer M1 of the second pad CP has the separated structure from the routing line RL and the first layer M1 of the first pad AP.

The auxiliary line AL is covered by a passivation layer PAS. It is preferable that the passivation layer PAS covers the upper surface and the sidewall surface of the auxiliary line AL. The auxiliary line AL is connected to the first layer M1 of the first pad AP, so it may be supplied with the driving power voltage from the first pad AP. It is preferable that the auxiliary line AL is made of a metal material having relatively low line resistance in order to supply the driving electric voltage uniformly over the whole surface of the emission area AA. That is, when line resistance of the auxiliary line AL is high, the voltage dropdown may be occurred in which as the resistance may be increased with being far from the first pad AP, the driving voltage may be lowered.

The auxiliary line AL is a circuitry link wire for supplying the driving voltage to the high resistance layer HL which would be a first electrode AE of the emission element ED stacked on the auxiliary line AL. Therefore, forming a contact hole CH at the passivation layer PAS covering the auxiliary line AL, the auxiliary line AL may be contacted to the high resistance layer HL stacked thereon.

The high resistance layer HL is deposited on the substrate SUB having the routing line RL, the auxiliary line AL, the reflective electrode RE and the first layer M1 made of the opaque metal material. Here, the high resistance layer HL covering the routing line RL, the auxiliary line AL, the reflective electrode RE and the first layer M1 of the first pad AP may be formed as being one sheet body. However, it is preferable that the high resistance layer HL covering the first layer M1 of the second pad CP is formed as having an island shape separated from other portions. The first pad AP may be an electrical terminal pad for supplying the electric voltage for driving the emission element ED, and the second pad CP may be an electrical terminal pad for supplying the common voltage. Therefore, the first pad AP and the second pad CP should not be directly connected each other. In another case, the high resistance layer HL may not cover the first layers M1 of the first pad AP and the second pad CP.

It is preferable that the high resistance layer HL includes a transparent conductive material having a relatively high electric resistance property. The electroluminescent lighting device according to the present disclosure may have the top emission structure. In other word, the illuminated lights may be provided to the top side of the substrate SUB. Therefore, the reflective electrode RE may be disposed on the substrate SUB, and the emission element ED may be disposed on the reflective electrode RE.

When the anode electrode of the emission element ED is made of the reflective material the same with the reflective electrode RE on the substrate SUB, the emission layer EL of the emission element ED may easily be deteriorated due to the concentrated electric current to the anode electrode. Therefore, it is preferable that the anode electrode has a relatively high electric resistance property. In the first embodiment of the present disclosure, the anode electrode of the emission element ED may be formed by depositing the high resistance layer HL on the reflective electrode RE.

For example, it is preferable that the material for the high resistance layer HL has a sheet resistance of $108 \sim 109 \Omega/\square$ higher than the transparent conductive materials such as indium tin oxide or indium zinc oxide. In one example, the high resistance layer HL may include a transparent conductive material such as conducting polymer material, a carbon material or a nanowire material.

For the conducting polymer material, it may include a solvent, a binder and an additives as well as the conductive body. Here, the conductive body of 1~10% contents in the conducting polymer may include PEDOT:PSS (poly(3,4-ethylenedioxythiophene) polystyrene sulfonate). The solvent of 80~90% contents in the conducting polymer material may include the pure water or alcohol. The binder of 10~20% contents in the conducting polymer material may include TEOS (tetraethly orthosilicate), SSQ, silicon-based polysiloxane or acryl-based polysiloxane. The additive of approximately 1% contents in the conducting polymer material may include leveling agent or surfactant.

For the carbon material, the conductive body may include a graphenen or a single-walled CNT (SWCNT) or a multi-walled CNT (MWCNT).

For the nanowire material, the conductive body may include a copper nanowire (CuNW), a silver nanowire (AgNW) or a gold nanowire (AuNW).

The high resistance layer HL according to the present disclosure may include a silicon-base material using TEOS and a conductive core such as a conducting polymer, a carbon material or a nanowire material.

The high resistance layer HL covering the routing line RL, the auxiliary line AL and the reflective electrode RE may be an anode layer of the emission element ED. Especially, the portions of the high resistance layer HL covering the auxiliary line AL may be the power line PL supplying the electric power to the pixel P. The portions of the high resistance layer HL covering the reflective electrode RE may be the first electrode AE of the emission element ED. The high resistance layer HL covering the routing line RL may play a role for preventing the metal material of the routing line RL from being oxidized or damaged by exposing to the external environment.

In addition, the high resistance layer HL may be further formed to the second layer M2 covering the first layer M1 of the first pad AP by extending from the portions covering the routing line RL. In the interim, the second layer M2 may be further formed as covering the first layer M1 of the second pad CP and being physically separated from the routing line RL.

The emission layer EL may be deposited on the high resistance layer HL within the emission area AA. It is preferable that the emission layer EL is formed to have one body of thin layer covering the whole surface of the emission area AA. For an example, the emission layer EL may include at least two emission portions vertically stacked for radiating white color lights. For another example, the emission layer EL may include a first emission portion and a second emission portion for radiating a white light by mixing a first color light and a second color light. Here, the first emission portion may include any one of a blue emission portion, a green emission portion, a red emission portion, a yellow emission portion, and a yellow-green emission portion to emit the first color light. In the interim, the second emission portion may include any one among a blue emission portion, a green emission portion, a red emission portion, a yellow emission portion, and a yellow-green emission portion, to emit the second color light having a complementary relation to the first color light.

The cathode layer CAT may be deposited on the substrate SUB as covering the emission area AA. The cathode layer CAT may be deposited on some of the non-emission area IA as well as the emission area AA. The cathode layer CAT may be formed as having the same area as the emission area AA or little larger area than the emission area AA. For example, the third layer M3 may be formed as extending to the both sides of the first non-emission area IA1 to contact with the second layer M2 of the first pad AP. In addition, the third layer M3 may be further formed as contacting with the second layer M2 of the second pad CP having the island shape at the middle of the first non-emission area IA1.

The electroluminescent lighting device according to the present disclosure has the top emission structure in which the illuminated light is provided to the top side of the substrate SUB. Therefore, it is preferable that the cathode layer CAT includes a transparent conductive material. For example, the cathode layer CAT may include the transparent conductive material such as indium tin oxide or indium zinc oxide.

The cathode layer CAT, as the electrode providing the common voltage, may have one sheet body structure covering whole surface of the emission area AA providing lights on the substrate SUB of the lighting device. Therefore, the cathode layer CAT may have a relatively large area. When the cathode layer CAT is made of a transparent conductive material having the relatively higher sheet resistance than the metal material, as the emission area AA is getting larger, the voltage dropdown may be more severe. In order to solve the problems due to the voltage dropdown, it is preferable that any structure is provided for lowering the sheet resistance of the cathode layer CAT.

The cathode layer CAT according to the present disclosure may have a structure in which the transparent conductive layer is stacked with an ultra-thin metal layer. For example, as shown as the enlarged circle portion in FIG. 2, the cathode layer CAT may include a lower transparent layer ITD, an ultra-thin metal layer TML and an upper transparent layer ITU. However, it is not restricted thereto, rather than that it may have a double layer structure in which one transparent layer and one ultra-thin metal layer are stacked.

The ultra-thin metal layer TML may include a single layered structure or a double layered structure having any one material or alloy material of two or more materials among silver (Ag), APC alloy (Ag/Pd/Cu), aluminum (Al), molybdenum (Mo), magnesium (Mg), calcium (Ca) or barium (Ba) having relatively low sheet electric resistance property.

Therefore, the cathode layer CAT may include a multiple layered structure such as a stacked structure of aluminum and ITO (indium tin oxide) (i.e., ITO/Al/ITO), and a stacked structure of APC alloy and ITO (i.e., ITO/APC/ITO).

The cathode layer CAT is directly contacted the emission layer EL in face. Therefore, within the pixel P area defined by the auxiliary line AL, the first electrode AE made of the high resistance layer HL, the emission layer EL and the cathode layer CAT are stacked sequentially in face. The portions of the cathode layer CAT corresponding to the pixel P may be defined as the second electrode CE. The second electrode CE is the some portion of the cathode layer CAT stacked on the emission layer EL as covering the whole surface of the emission area AA of the substrate SUB, which is corresponding to one pixel P area.

Therefore, excepting the area occupied by the passivation layer PAS covering the auxiliary line AL in the emission area AA, most of all area may provide the illuminating lights. As the result, the electroluminescent lighting device according to the first embodiment of the present disclosure can ensure the maximized emission area within the emission area AA.

The encapsulation layer EN may be stacked on the cathode layer CAT. The encapsulation layer EN is for protecting the emission element ED formed in the emission area AA. The encapsulation layer EN may include a single layered material, or a multiple layered material. In one example, the encapsulation layer EN may include a first inorganic layer, an organic layer on the first inorganic layer, and a second inorganic layer on the organic layer.

The inorganic layers are for preventing the foreign materials such as moisture and oxygen from intruding into the emission element ED. In one example, the inorganic layers may include at least any one of silicon nitride, aluminum nitride, zirconium nitride, titanium nitride, hafnium nitride, tantalum nitride, silicon oxide, aluminum oxide, titanium oxide and so on. The inorganic layers may be formed by the chemical vapor deposition method or the atomic layer deposition method.

In one example, the organic layer may be formed of the organic resin material such as silicon oxycarbide (SiOC), acryl or epoxy. The organic layer may be formed by the coating method such as the inkjet method or the slit coating method.

The encapsulation layer EN may cover all emission area AA, and some of the non-emission area IA. However, it is preferable that the encapsulation layer EN does not cover the first pad AP and the second pad CP to expose them.

On the encapsulation layer EN, the cover glass CG may be attached. The electroluminescent lighting device according to the present disclosure provides the illuminated lights to the top side from the substrate SUB, i.e., to the cover glass CG. Therefore, it is preferable that the cover glass CG is made of a transparent glass material. To attach the cover glass CG to the encapsulation layer EN, an optical adhesive OA may be applied therebetween. It is preferable that the cover glass CG is attached as not covering the first pad AP and the second pad CP but exposing them.

Second Embodiment

Figure 3:
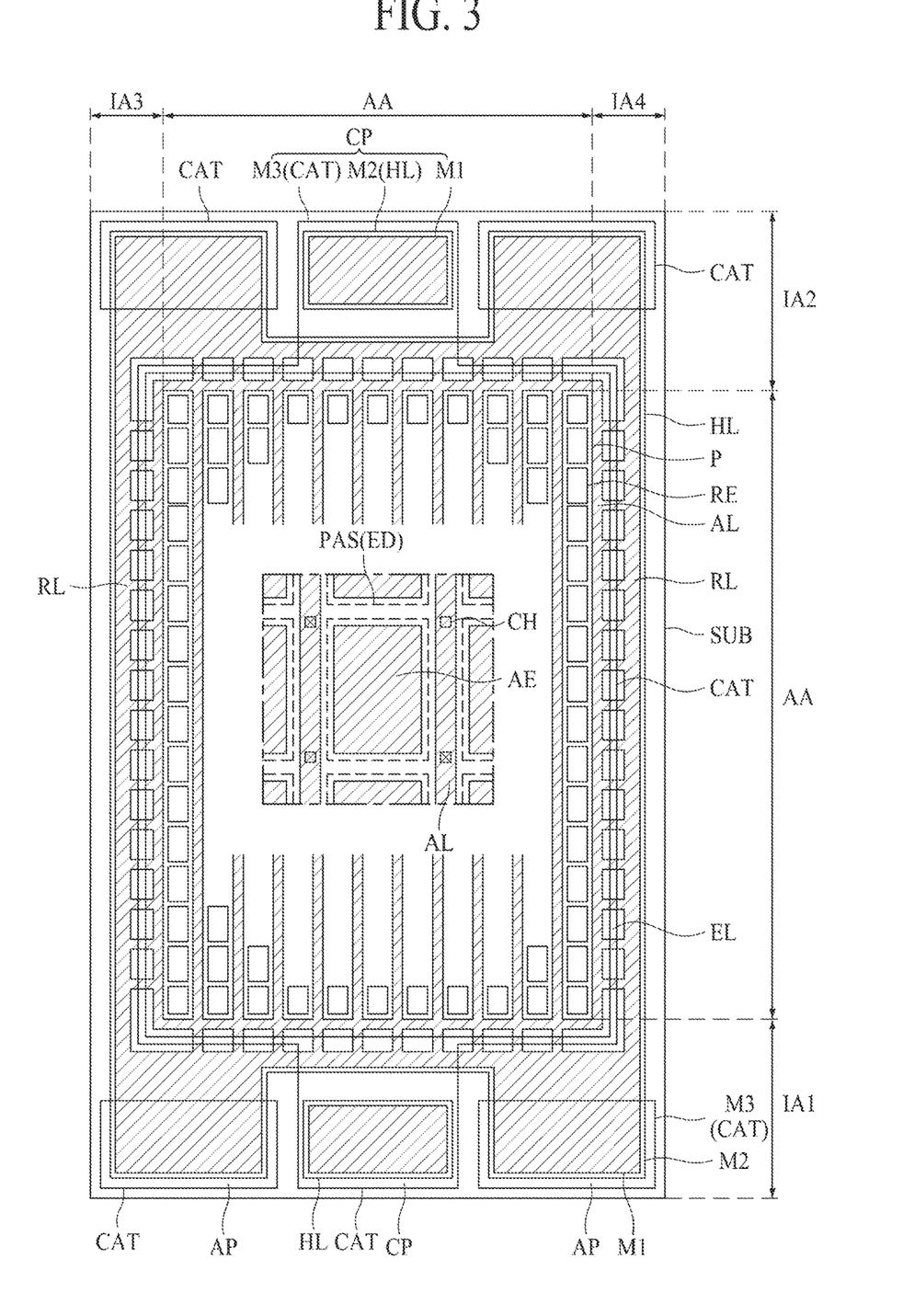
FIG. 3 is a plan view illustrating an electroluminescent lighting device according to the second embodiment of the present disclosure.

Hereinafter, referring to FIGS. 3 and 2, an electroluminescent lighting device according to the second embodiment of the present disclosure will be explained. FIG. 3 is a plan view illustrating an electroluminescent lighting device according to the second embodiment of the present disclosure. The base structure of the electroluminescent lighting device according to the second embodiment is basically very similar with the first embodiment. The difference is on the disposing structure of the auxiliary line AL.

Referring to FIGS. 2 and 3, the electroluminescent lighting device according to the second embodiment of the present disclosure comprises a substrate SUB, a routing line RL, an auxiliary line AL, a reflective electrode RE and a high resistance layer HL. In addition, it further comprises an emission layer EL, a cathode layer CAT, an emission element ED, a first pad AP, a second pad CP, an encapsulation layer EN and a cover glass CG, which are the same as the first embodiment so the same explanation for these elements will not be duplicated.

The substrate SUB, as a based substrate (or a base layer), includes a plastic material or a glass material. For example, the substrate SUB may include an opaque or a colored polyimide material. The substrate SUB may include a flexible substrate or a rigid substrate. Further, the substrate SUB may be formed of an opaque material to provide the lights in only one direction of the substrate SUB, or may be formed of a transparent material to provide the lights in both directions of the substrate SUB.

The substrate SUB may include an emission area AA and a non-emission area IA. The emission area AA is disposed in the most middle portions of the substrate SUB which can be defined as an area for emitting the lights.

The non-emission area IA is provided in the circumferential area of the substrate SUB to surround the emission area AA, which may be defined as an area in which light is not provided therefrom. In one example, the non-emission area IA may include a first non-emission area IA1 disposed at the first side of the substrate SUB, a second non-emission area IA2 disposed at the second side parallel to the first non-emission area IA1, a third non-emission area IA3 disposed at the third side perpendicular to the first non-emission area IA1, and a fourth non-emission area IA4 disposed at the fourth side parallel to the third non-emission area IA3.

A buffer layer (not shown) may be deposited on the whole surfaces of the substrate SUB. In the case that the glass or metal material is used for the substrate SUB, the buffer layer may be omitted. For the case of a flexible lighting device, it is preferable to deposit the buffer layer, at first on the plastic substrate SUB.

The routing line RL is arranged at the non-emission area IA on the buffer layer (not shown) or the substrate SUB. For example, the routing line RL may be disposed as a rectangular band shape continuously linked along the path from the first non-emission area IA1, the second non-emission area IA2, the third non-emission area IA3 to the fourth non-emission area IA4 to surround the emission area AA. A first layer M1 of the first pad AP may be further included as being extended from routing line RL to the first non-emission area IA1 and/or the second non-emission area IA2. In addition, a first layer M1 of the second pad CP further included. It is preferable that the first layer M1 of the second pad CP is physically and electrically separated from the first layer M1 of the first pad AP. For example, the first layer M1 of the first pad AP may be separated into two parts in which each of them are disposed at both sides of the first non-emission area IA1, respectively, and the first layer M1 of the second pad CP may be disposed at the middle of the first non-emission area IA1.

The auxiliary line AL is formed on the substrate SUB or the buffer layer. Especially, the auxiliary line AL may be arranged as being a strip pattern. As FIG. 3 shows that the auxiliary line AL is patterned as having a thin line along to vertical direction, but it is not restricted thereto. By this strip structure of the auxiliary line AL, the pixel area P may be defined as corresponding to the long slit shape along to vertical direction. The auxiliary line AL may be uniformly distributed within the emission area AA in order to maintain a uniform electric power voltage.

In another example, the auxiliary line AL may have a structure in which a plurality of horizontal lines is arrayed along to vertical direction within the emission area AA. In this case, the shape of pixel P defined by the strip type auxiliary line AL may have a long slit shape to horizontal direction.

The reflective electrode RE is disposed within the pixel P area defined by the auxiliary line AL. The reflective electrode RE may have an island shape separated from the auxiliary line AL with a predetermined distance. In the structure as shown in FIG. 3, unlike the first embodiment, the reflective electrode RE may have the elongated rectangular shape along vertical direction.

It is preferable that the routing line RL, the auxiliary line AL and the reflective electrode RE are made of the same material. For example, depositing an opaque metal material on the substrate SUB or the buffer layer, and patterning it to form the routing line RL, the auxiliary line AL and the reflective electrode RE. The routing line RL, the first layer M1 of the first pad AP and the auxiliary line AL may be linked each other, but the reflective electrode RE may have an island shape to be separated from them. Further, it is preferable that the first layer M1 of the second pad CP has the separated structure from the routing line RL and the first layer M1 of the first pad AP.

The auxiliary line AL is covered by a passivation layer PAS. It is preferable that the passivation layer PAS covers the upper surface and the sidewall surface of the auxiliary line AL. The auxiliary line AL may be an electrical wiring for supplying the driving voltage to the high resistance layer HL. Therefore, a contact hole CH at the passivation layer PAS covering the auxiliary line AL may be formed to contact the auxiliary line AL with the high resistance layer HL deposited on the passivation layer PAS.

In the second embodiment, the auxiliary line AL has the vertically elongated strip shape. Therefore, the contact hole CH may have a vertically elongated rectangular shape corresponding to the shape of the auxiliary line AL and a plurality of contact holes is disposed on the auxiliary line AL with a predetermined distance.

The high resistance layer HL is deposited on the substrate SUB having the routing line RL, the auxiliary line AL, the reflective electrode RE and the first layer M1 made of the opaque metal material. Here, the high resistance layer HL covering the routing line RL, the auxiliary line AL, the reflective electrode RE and the first layer M1 of the first pad AP may be formed as being one sheet body. However, it is preferable that the high resistance layer HL covering the first layer M1 of the second pad CP is formed as having an island shape separated from other portions. The first pad AP may be an electrical terminal pad for supplying the electric voltage for driving the emission element ED, and the second pad CP may be an electrical terminal pad for supplying the common voltage. Therefore, the first pad AP and the second pad CP should not be directly connected each other. In another case, the high resistance layer HL may not cover the first layers M1 of the first pad AP and the second pad CP.

It is preferable that the high resistance layer HL includes a transparent conductive material having a relatively high electric resistance property. The electroluminescent lighting device according to the present disclosure may have the top emission structure. Therefore, the reflective electrode RE reflecting the lights to the top side may be disposed on the substrate SUB, and the emission element ED may be disposed on the reflective electrode RE.

In the second embodiment of the present disclosure, the anode electrode of the emission element ED may be formed by depositing the high resistance layer HL on the reflective electrode RE. For example, it is preferable that the material for the high resistance layer HL has a sheet resistance of $10^8 \sim 10^9 \Omega/\square$. In addition, the high resistance layer HL may include a transparent conductive material such as conducting polymer material, a carbon material or a nanowire material.

For the conducting polymer material, it may include a solvent, a binder and an additives as well as the conductive body. Here, the conductive body of 1~10% contents in the conducting polymer may include PEDOT:PSS (poly(3,4-ethylenedioxythiophene) polystyrene sulfonate). The solvent of 80~90% contents in the conducting polymer material may include the pure water or alcohol. The binder of 10~20% contents in the conducting polymer material may include TEOS (tetraethly orthosilicate), SSQ, silicon-based polysiloxane or acryl-based polysiloxane. The additive of approximately 1% contents in the conducting polymer material may include leveling agent or surfactant.

For the carbon material, the conductive body may include a graphenen or a single-walled CNT (SWCNT) or a multi-walled CNT (MWCNT).

For the nanowire material, the conductive body may include a copper nanowire (CuNW), a silver nanowire (AgNW) or a gold nanowire (AuNW).

The high resistance layer HL according to the present disclosure may include a silicon-base material using TEOS and a conductive core such as a conducting polymer, a carbon material or a nanowire material.

The high resistance layer HL covering the routing line RL, the auxiliary line AL and the reflective electrode RE may be an anode layer of the emission element ED. Especially, the portions of the high resistance layer HL covering the auxiliary line AL may be the power line PL supplying the electric power to the pixel P. The portions of the high resistance layer HL covering the reflective electrode RE may be the first electrode AE of the emission element ED. The high resistance layer HL covering the routing line RL may play a role for preventing the metal material of the routing line RL from being oxidized or damaged by exposing to the external environment.

In addition, the high resistance layer HL may be further formed to the second layer M2 covering the first layer M1 of the first pad AP by extending from the portions covering the routing line RL. In the interim, the second layer M2 may be further formed as covering the first layer M1 of the second pad CP and being physically separated from the routing line RL.

For other elements, as they are similar with those of the first embodiment, the duplicated explanation will be omitted.

The electroluminescent lighting device explained with above two embodiments has the characteristics in which the first electrode AE of the emission element ED is formed of the high resistance layer HL. Especially, the high resistance layer HL is disposed as covering the whole surface of the emission area AA, and it may form the emission element ED with the emission layer EL and the cathode layer CAT sequentially stacked on the high resistance layer HL. Further, as the illuminated lights are not provided to the bottom side where the auxiliary line AL is disposed, the aperture ratio may not be reduced by the auxiliary line AL. On the auxiliary line AL, the high resistance layer HL, the emission layer EL and the cathode layer CAT are stacked so the emission element ED is also formed. Therefore, whole surface of the emission area AA is configured to the emission element ED for providing the illuminated lights, so that the aperture ratio has the maximum value as it can have.

The high resistance layer HL which is the anode electrode for the emission element ED of the electroluminescent lighting device according to the present disclosure has relatively higher electric resistance than the transparent conductive material such as indium tin oxide or indium zinc oxide. Therefore, as there is no fuse pattern for preventing the short circuit problem between the pixel P areas defined by the auxiliary line AL, the short circuit problem may be effectively prevented.

The high resistance layer HL may be supplied with the driving voltage from the auxiliary line AL. To do so, it is preferable that the auxiliary line AL is physically and electrically connected to the high resistance layer HL. Therefore, it is preferable that the passivation layer PAS covering the auxiliary line AL has the contact hole CH. The contact hole CH makes an electric connection between the auxiliary line AL and the high resistance layer HL so the driving voltage can be supplied to the high resistance layer HL working as the anode electrode. However, other portions of the auxiliary line AL are not contact to the high resistance layer HL.

For example, when the auxiliary line AL is not covered by the passivation layer PAS, all portions of the auxiliary line AL may be exposed so that all portions of the auxiliary line AL may directly contact to the high resistance layer HL. In that case, the electric current may be concentrated around of the high resistance layer HL directly connecting to the auxiliary line AL, so that the high resistance layer HL cannot play a role for preventing the short circuit problem. That is, under this condition, when any one pixel P has a short circuit problem, this defect may be spread over the whole of the emission area AA which causes the fail of lighting device.

In addition, with the above condition, as the emission layer EL and the cathode layer CAT are stacked on the auxiliary line AL to form the emission element ED, the brightness may be remarkably increased around the auxiliary line AL. Under this condition with long period, the auxiliary line AL may be deteriorated or broken down due to the overheat and then the emission layer EL on the auxiliary line AL may be damaged which also causes the short circuit problem. In order to prevent these problems, it is preferable that the auxiliary line AL is covered by the passivation layer PAS, and the auxiliary line AL is connected to the high resistance layer HL via the contact hole CH having a proper size suitable for providing the driving voltage to the high resistance layer HL.

In the electroluminescent lighting device, it is preferable that the passivation layer PAS has a structure covering the auxiliary line AL by directly contacting the upper surface excepting the contact hole CH and side wall surface of the auxiliary line AL. Especially, it is preferable that the passivation layer PAS is disposed the separated space between the side wall of the auxiliary line AL and the side of the reflective electrode RE to keep the auxiliary line AL being not in contact with the reflective electrode RE through the high resistance layer HL directly. The passivation layer covering the side of the auxiliary line AL may have a structure and function for preventing the reflective electrode RE disposed within the pixel P area and the first electrode AE including the high resistance layer HL from being directly contacted with the auxiliary line AL.

The reflective electrode RE is separated from the auxiliary line AL and they are not electrically contacted by the passivation layer PAS covering the auxiliary line AL. Therefore, even though the reflective electrode RE is contact with the high resistance layer HL in face, the amount of the electric current may be limited by the resistance of the high resistance layer HL so that the electric current is not concentrated to the reflective electrode RE.

The contact hole CH formed at the passivation layer PAS for contacting the auxiliary line AL to the high resistance layer HL may be formed as having various size and shape according to the conditions and the requirements of the lighting device. For one example, in the case that the auxiliary line AL has a mesh shape as shown in FIG. 1, the contact hole CH may be disposed at each of the crossing area of the meshes. For another example, further contact holes may be disposed between the crossing areas of the meshes. Considering the aperture ratio, it is preferable that the size of the contact hole CH is smaller than the width of the auxiliary line AL.

For another example, in the case that the auxiliary line AL has the strip shape as shown in FIG. 3, a plurality of contact holes CH having a square shape may be formed as being distributed on the auxiliary lines AL. Otherwise, the contact hole CH may be formed as having an elongated rectangular shape along to the length of the auxiliary line AL.

In the electroluminescent lighting device according to the present disclosure, the cathode layer CAT includes a transparent conductive material or a semi-transparent conductive material. For one example, with only the transparent conductive material, the top emission type may be established. For another example, by stacking the transparent conductive layer ITU or ITD with the ultra-thin metal layer TML, the cathode layer CAT may be formed as the semi-transparent conductive layer. In this case, some of the lights radiated from the emission layer EL may directly pass through the cathode layer CAT to be the illuminated lights, and others may be reflected to the reflective electrode RE by the ultra-thin metal layer TML. This reflected lights by the cathode layer CAT may be reflected by the reflective electrode RE again and pass through the cathode layer CAT to be the illuminated lights.

The reflections between the cathode layer CAT and the reflective electrode RE may be repeated several times. Using the refractive index by controlling the kinds and thickness of the ultra-thin metal layer TML included in the cathode layer CAT, the transmittance of specific wavelength may be maximized. That is, using the micro-cavity effect, the light emission efficiency of the emission layer EL can be maximized or enhanced.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electroluminescent lighting device, comprising:
   a substrate having an emission area and a non-emission area adjacent to the emission area;
   a routing line having at least a portion adjacent to the emission area at the non-emission area;
   an auxiliary line being disposed in the emission area, the auxiliary line connecting the routing line and having at least a portion disposed within a pixel area;
   a reflective electrode disposed within the pixel area;
   a high resistance layer covering the routing line, the auxiliary line and the reflective electrode;
   an emission layer on the high resistance layer over the emission area; and
   a cathode layer on the emission layer.

2. The device according to claim 1, wherein the auxiliary line has a plurality of strip patterns arrayed with a predetermine distance within the emission area; and
   wherein the pixel area is disposed between each of the strip pattern.

3. The device according to claim 1, wherein the auxiliary line has a mesh pattern arrayed with a predetermined distance within the emission area; and
   wherein the pixel area is disposed in each of the mesh pattern.

4. The device according to claim 1, wherein the routing line, the auxiliary line and the reflective electrode include an opaque metal material; and
   wherein the reflective electrode is separated from the auxiliary line with a predetermine distance.

5. The device according to claim 1, wherein an emission element is configured by a sequentially stacking structure of the high resistance layer, the emission layer and the cathode layer within the pixel area.

6. The device according to claim 1, wherein the high resistance layer is disposed in a space between the auxiliary line and the reflective electrode.

7. The device according to claim 1, further comprising:
   a passivation layer disposed under the high resistance layer and covering the auxiliary layer; and
   a contact hole penetrating the passivation layer for connecting the auxiliary line and the high resistance layer.

8. The device according to claim 7, wherein the passivation layer is disposed in a space between the auxiliary line and the reflective electrode.

9. The device according to claim 7, wherein the passivation layer covers the auxiliary line as contacting an upper surface and a sidewall surface of the auxiliary line.

10. The device according to claim 9, wherein the high resistance layer is disposed in a space between a sidewall surface of the passivation layer contacting the sidewall surface of the auxiliary line and the reflective electrode.

11. The device according to claim 1, wherein the high resistance layer has a sheet resistance with a range of $10^8 \sim 10^9 \Omega/\square$.

12. The device according to claim 1, wherein the high resistance layer includes a conductive body of 1~10% contents, a solvent of 80~90% contents, a binder of 10~20% contents and an additive of 1% contents.

13. The device according to claim 12, wherein the conductive body includes PEDOT:PSS (poly(3,4-ethylenedioxythiophene) polyatyrene sulfonate) as a conducting polymer.

14. The device according to claim 12, wherein the binder includes any one of TEOS (tetraethly orthosilicate), SSQ, silicon-based polysiloxane and acryl-based polysiloxane.

15. The device according to claim 12, wherein the conductive body includes any one of a graphenen or a single-walled CNT (SWCNT) or a multi-walled CNT (MWCNT).

16. The device according to claim 12, wherein the conductive body includes any one of a copper nanowire (CuNW), a silver nanowire (AgNW) and a gold nanowire (AuNW).

17. The device according to claim 1, wherein the cathode layer includes a transparent conductive layer and a metal layer stacked each other.

18. The device according to claim 17, wherein the cathode layer further includes:
   a first transparent conductive layer under the metal layer; and
   a second transparent conductive layer on the metal layer.

* * * * *